United States Patent [19]

Lison et al.

[11] Patent Number: 5,224,235
[45] Date of Patent: Jul. 6, 1993

[54] ELECTRONIC COMPONENT CLEANING APPARATUS

[75] Inventors: Peter K. Lison, Methuen; Keith T. Baines, Winchendon, both of Mass.

[73] Assignee: Digital Equipment Corporation, Maynard, Mass.

[21] Appl. No.: 722,961

[22] Filed: Jun. 28, 1991

[51] Int. Cl.$^5$ .............................................. A47L 7/00
[52] U.S. Cl. ................................ 15/302; 15/309.2; 15/345
[58] Field of Search ................... 15/302, 321, 322, 345

[56] References Cited

U.S. PATENT DOCUMENTS

| | | |
|---|---|---|
| 868,901 | 10/1907 | Williams ............................. 15/345 |
| 2,455,514 | 8/1948 | Mead . |
| 2,659,915 | 10/1953 | Sears . |
| 3,161,900 | 12/1964 | Hornschuch et al. ............... 15/345 |
| 3,226,259 | 4/1966 | Armbrust . |
| 3,498,303 | 3/1970 | Eaves et al. . |
| 3,530,517 | 9/1970 | Nohl . |
| 3,574,239 | 4/1971 | Sollerud . |
| 3,594,849 | 7/1971 | Coshow . |
| 3,678,534 | 7/1972 | Hilbig ................................. 15/345 |
| 3,816,868 | 6/1974 | Dotsko . |
| 3,874,022 | 4/1975 | Wogoman et al. . |
| 3,915,739 | 10/1975 | Maahs et al. . |
| 3,919,729 | 11/1975 | Cannan . |
| 4,023,233 | 5/1977 | Prestwich . |
| 4,073,030 | 2/1978 | Albishausen . |
| 4,129,919 | 12/1978 | Fitch et al. . |
| 4,168,562 | 9/1979 | Maasberg . |
| 4,263,693 | 4/1981 | Mekelburg ........................... 15/322 |
| 4,282,626 | 8/1981 | Schneider . |
| 4,544,439 | 10/1985 | Solomon . |
| 4,589,926 | 5/1986 | Holmstrand . |
| 4,594,748 | 6/1986 | Warfvinge . |
| 4,788,739 | 12/1988 | Brewer et al. ...................... 15/322 |
| 4,872,920 | 10/1989 | Flynn et al. . |
| 4,938,239 | 7/1990 | Theurer et al. . |
| 5,074,132 | 12/1991 | Koller ............................. 15/322 X |

FOREIGN PATENT DOCUMENTS

1552047  11/1968  France ................................. 15/302

*Primary Examiner*—Chris K. Moore
*Attorney, Agent, or Firm*—Clayton L. Satow; Barry N. Young

[57] ABSTRACT

A local area of an electronic assembly, including a single electronic component or a cluster of components mounted to a printed wiring board, is cleaned. A shroud is positioned about the local area and aqueous cleaning solution is sprayed on the lead joints of the electronic component. To remove the cleaning liquids, a vacuum is drawn from the shroud through a central baffle which is positioned close to the electronic component. Adjustable gates are provided about the base of the shroud to permit air flow into the shroud. Adjustment of the gates controls turbulence of the cleaning solution and subsequent direction of air flow for drying of the electronic component, leads and board. Shroud/baffle assemblies are selected and nozzle assemblies are tilted to correspond to different sizes of electronic components.

17 Claims, 7 Drawing Sheets

ELECTRONIC COMPONENT CLEANING APPARATUS

BACKGROUND OF THE INVENTION

At various stages in manufacturing electronic assemblies, electric components and the electronic wiring boards on which they are mounted must be cleaned. For example, when forming a soldered joint, solder is placed on a board at locations where component leads are to be coupled to a printed circuit. An acidic flux is typically applied to the solder before fixing the leads thereto in order to clean oxides and otherwise prepare the solder. After the leads are fixed to the solder the flux must be cleaned from the board.

The boards may be passed through assembly line cleaners in which all components and the entire board are cleaned to remove solder joint flux residues and other ionic and nonionic contaminants. At other times, such as in repairing a board or in implementing an engineering change, it is necessary to clean just a local area of the board such as around the soldered joints of a component on the board. Conventionally, both in-line and localized cleaning processes utilize CFC solvents such as 111 trichlorethane. However, because CFCs have been found to be damaging to the environment, they are being replaced, at least in the in-line systems, with aqueous based cleaning solutions, specifically saponifiers mixed in water. To date, although aqueous systems have been developed for in-line cleaning processes, CFCs are still used in localized cleaning. Typically, the CFCs are simply sprayed on local areas.

SUMMARY OF THE INVENTION

In accordance with the present invention, a local area of an electronic assembly, such as about lead joints of an individual component or a cluster of components mounted on a printed wiring board, is cleaned by supporting a nozzle assembly over the local area with a shroud surrounding the area. Aqueous cleaning solution is sprayed on the area and withdrawn by vacuum applied to a central baffle within the shroud. The area may be thoroughly cleaned without contamination of any surrounding components. After cleaning, the area may be rinsed by rinse liquid applied through the same nozzles and withdrawn by the vacuum system. Air drawn through gates about the base of the shroud mixes with the sprayed liquid to create turbulence for better cleaning and rinsing action. Finally, the area may be dried by pulling air through the gates about the base of the shroud. Preferably the gates are adjustable to create proper turbulence and for directing the flow of liquid or drying air about any electronic component.

The preferred apparatus for thus cleaning the local area of the electronic assembly comprises a plurality of nozzles, each for spraying a fan shaped spray onto the connecting leads of a component. The nozzles are preferably tiltable relative to a nozzle support structure to adjust the spray angle. The shroud surrounds a spray volume below the nozzles and has an open base to be positioned about the electronic component. The base has a cross-sectional area which is smaller than the cross-sectional area of the shroud adjacent to the nozzle assembly to prevent interference with adjacent components at the base while permitting the spray to be angled inwardly. The shroud, and an attached central vacuum baffle, are removable from the valve support structure. Thus, a particular shroud/baffle configuration may be selected according to the size of the electronic component or area being cleaned. Preferably, the baffle extends to within about 0.1 inch of the top of the component. To surround typical electronic components, the shroud has a rectangular cross-section and four nozzles are provided, one for each side of the component being cleaned. Each gate may be adjustable by a sliding plate with openings which are moved relative to gate openings at the base of the shroud. A check valve leads into each nozzle to prevent dripping of cleaning solution or rinse liquid when neither is being sprayed.

A system embodying the present invention may be portable and is thus particularly suited to field repairs. It not only avoids the use of CFCs but also attendant site expenses such as special ventilation and fire prevention safeguards. It greatly reduces the cycle time of a repair or rework process.

BRIEF DESCRIPTION OF THE DRAWINGS

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF A PREFERRED EMBODIMENT

Figure 1:
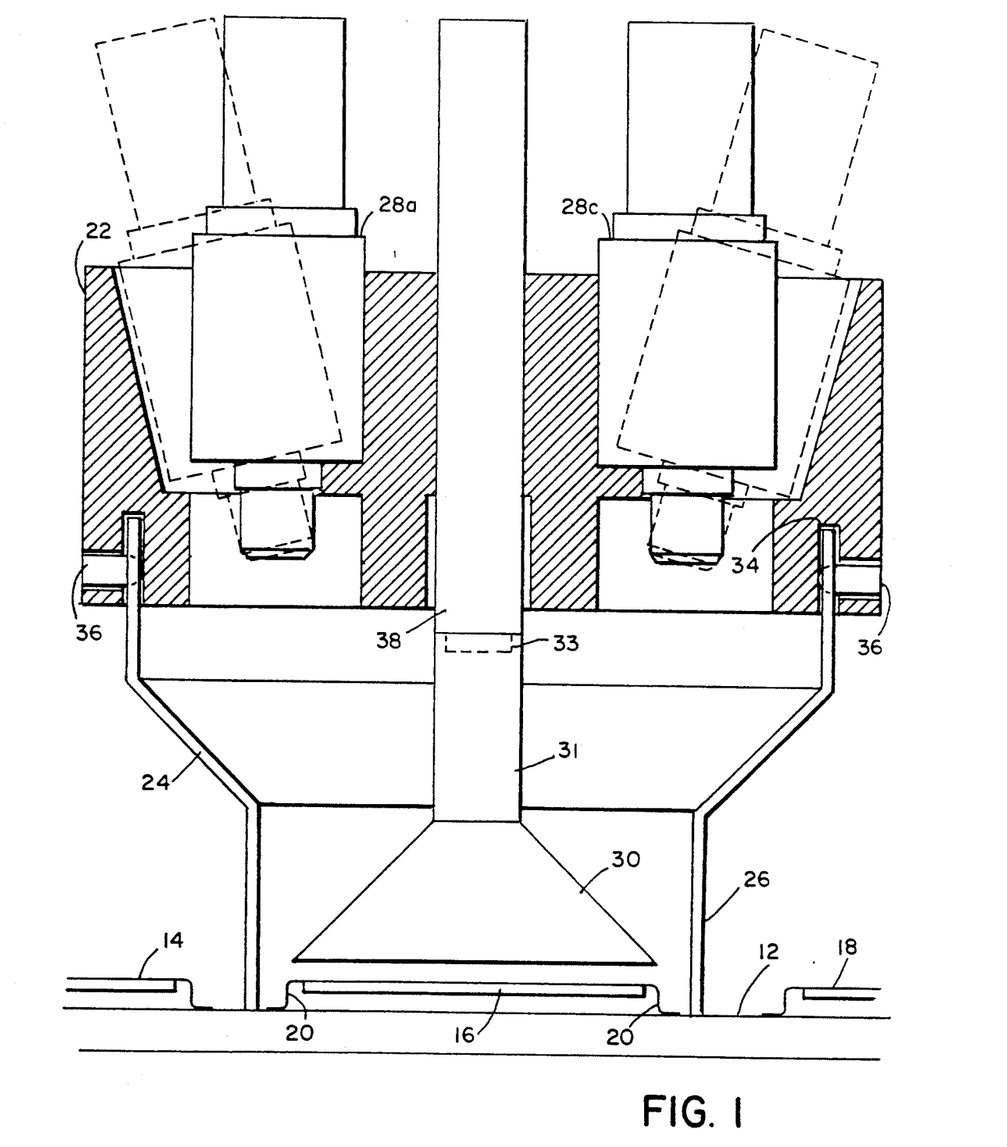
FIG. 1 is a cross-sectional view of a cleaning apparatus embodying the present invention.

FIG. 1 illustrates a printed wiring board 12 having a plurality of electronic components 14, 16 and 18 mounted thereon. Each component is supported on many lead pins 20 soldered at joints to the board. Positioned over the single component 16 is the cleaning apparatus of the present invention. The apparatus includes a nozzle support structure 22 which is itself supported on a shroud 24 which rests against the printed wiring board 12. The shroud 24 is relatively narrow at its base 26 to avoid interference with the adjacent components 14 and 18. However, it is wider at its upper end adjacent to the nozzle support 22 to enclose a volume which surrounds four nozzles 28a, 28b, 28c and 28d (see FIG. 2). Each nozzle assembly 28 is tiltable to spray a fan-shaped spray of cleaning solution or rinse liquid along pins 20 of the electronic component. With the fan-shaped spray, the spray may be directed simultaneously toward the full row of pins on a side of the component 16 with a minimal spray cross-sectional area and thus a minimal use of liquid.

Figures 3, 4:
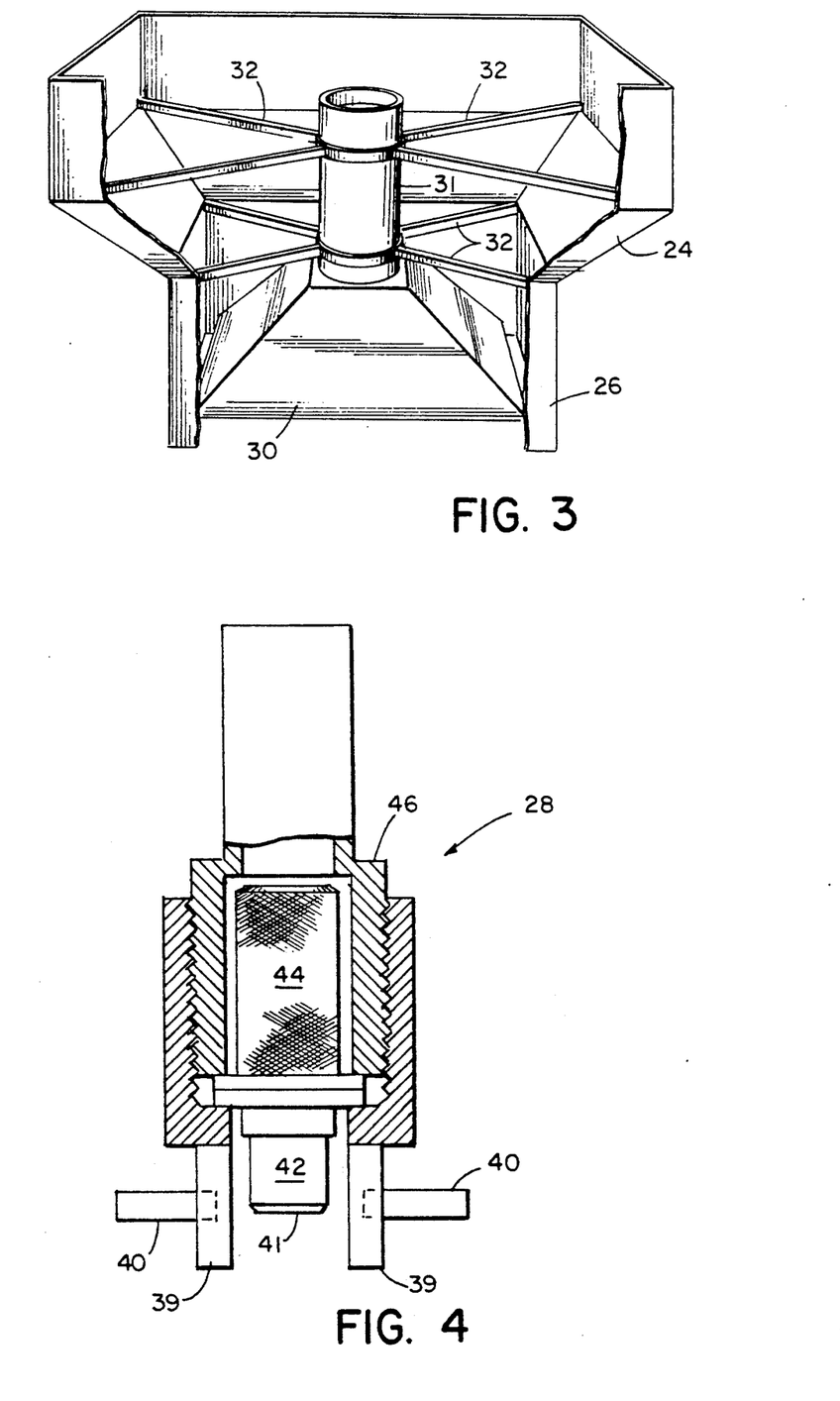
FIG. 3 illustrates a shroud and baffle assembly removed from the nozzle support structure.
FIG. 4 is a cross-sectional view of a tiltable nozzle assembly taken along line 4—4 of FIG. 2.

A central vacuum return baffle 30 and pipe 31 are connected to and centered within the shroud 24 by ribs 32 which extend to the corners of the shroud (see FIG. 3). The shroud and vacuum return baffle are removable from the nozzle support block 22. When coupled to the block, the shroud is fitted into a rectangular peripheral groove 34 in the block 22 and retained by ball detents 36. A pipe 31 from the baffle 30 fits over an extension 33 to connect to a vacuum conduit 38.

It is best that the baffle 30 extend to a position very close to the top of the electronic component, preferably about 0.1 inch from the component. Also, the length of the fan shaped spray along the length of the pins 20 is determined by the height of the nozzles. Thus, the heights of the shroud 24 and the baffle 30 are determined by the size of the particular component being cleaned. A component which has a large number of pins and covers a larger area of the printed wiring board 12 requires a taller shroud. The length of the baffle 30 and pipe 31 are determined by the height of the shroud and the height of the component. By making the shroud/baffle assembly removable, a number of interchangeable assemblies may be used for different component areas and heights.

To allow for different widths of the components and different heights of the shroud 24, the nozzle assemblies 28 are adjustably tilted to direct the spray against the pins. To that end, as illustrated in FIG. 4, each valve assembly 28 is supported on pivot pins 40 which extend from plates 39. These pins are coaxial with the linear nozzle orifice 41 at the end of the cylinder 42 so that the nozzle assemblies pivot about the orifice and thus the source of the spray. As also illustrated in FIG. 4, a check valve 44, which includes a filter screen, is clamped to the nozzle cylinder by a threaded nozzle retainer 46.

Figure 2:
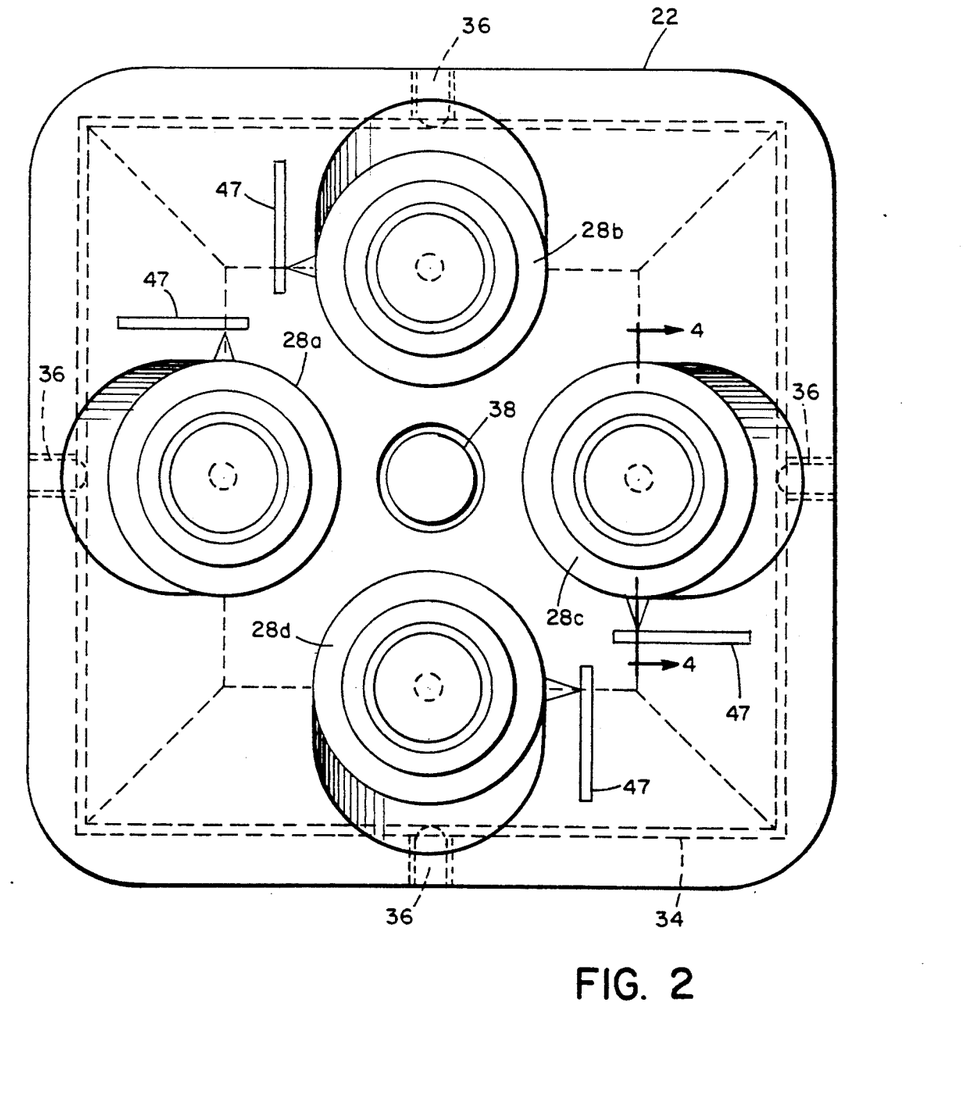
FIG. 2 is a top view of the apparatus of FIG. 1.

As illustrated in FIG. 2, an indicator 47 may be positioned adjacent to each nozzle assembly to indicate the angle at which the nozzle is positioned. That angle is dictated by the specific component being cleaned.

Figure 5A:
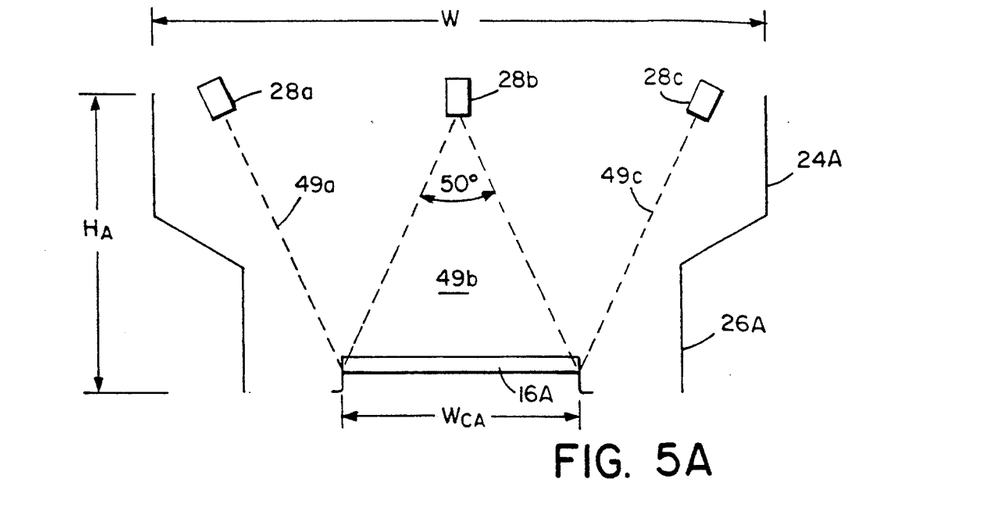
FIGS. 5A and 5B illustrate two interchangeable shroud/baffle assemblies for different electronic components.
Figure 5B:
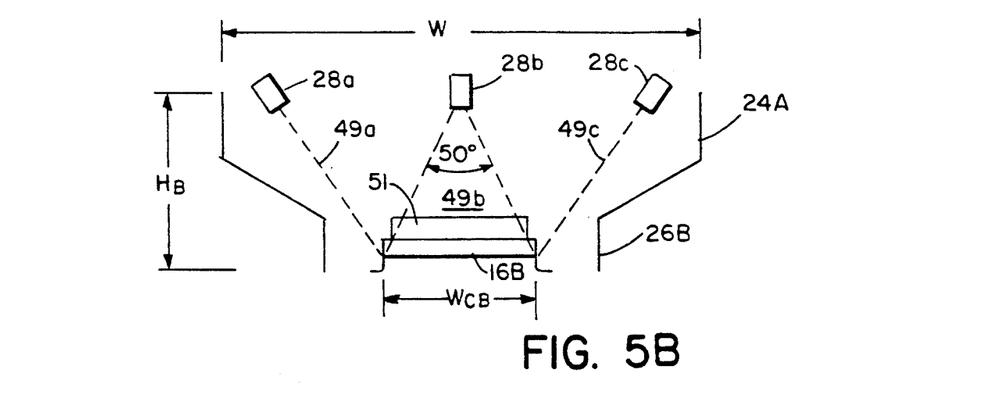
Figure 5C:
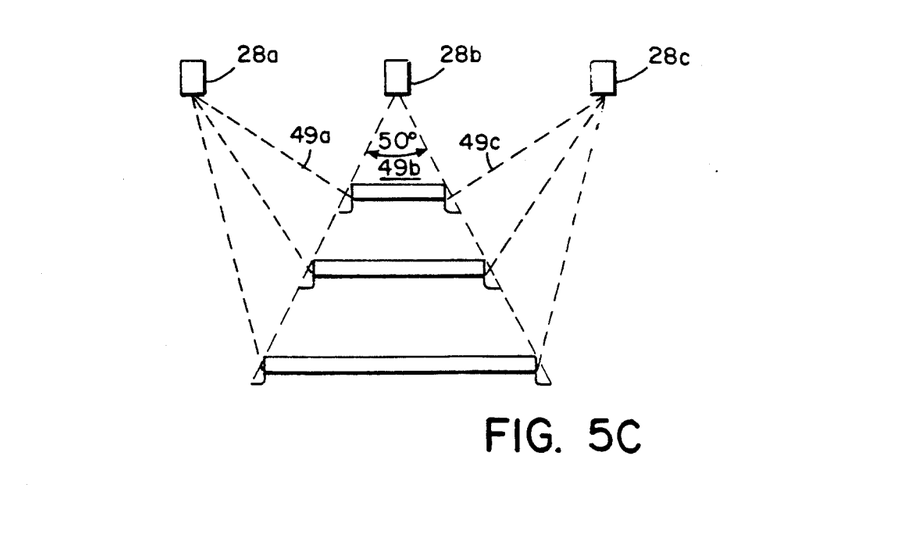

FIGS. 5A, 5B and 5C illustrate sizing of the shroud/baffle assemblies and tilting of the sprays to match different sizes of electronic components. The two shrouds of FIGS. 5A and 5B are of the same width W so that they may be interchangeably connected to a common nozzle support structure. Three of the sprays 49a, 49b and 49c are illustrated in broken lines. It can be seen from the view of spray 49b that the spray fans out 50° along the length of a set of component pins. By changing the height of the shroud, the width of the spray where it intersects the component pins can be varied. Thus, the taller height $H_A$ of the shroud 24A provides a wider width of the spray 49b to match the wider component width $W_{CA}$ in FIG. 5A; and the shorter height of $H_B$ shroud 24B provides a narrower width to match component width $W_{CB}$ in FIG. 5B. Because the orifices of the nozzles are in a fixed location relative to the width W, they must be tilted to properly direct them to the pins of the component. Thus, as can be seen from sprays 49a and 49c, the shorter component of FIG. 5B requires a greater tilt angle.

The change in shroud height and spray angle can also be seen in the schematic illustration of FIG. 5C. The components of different sizes are positioned along the spray 49b at a proper height to set the appropriate spray width. The sprays are then angled to intersect the component lead pins.

The length of the baffle 30 and pipe 31 is determined by the height of the shroud and the height of the component. In FIG. 5B, the component 16B has a heat sink 51 mounted thereon, so that component is taller than the component 16A of FIG. 5A. Thus, due to both the shorter shroud 24B and the taller component 16B, 51, the baffle and pipe 30, 31, for the shroud of FIG. 5B would be particularly short relative to the baffle and pipe 30, 31 for the shroud of FIG. 5A.

Figure 6:
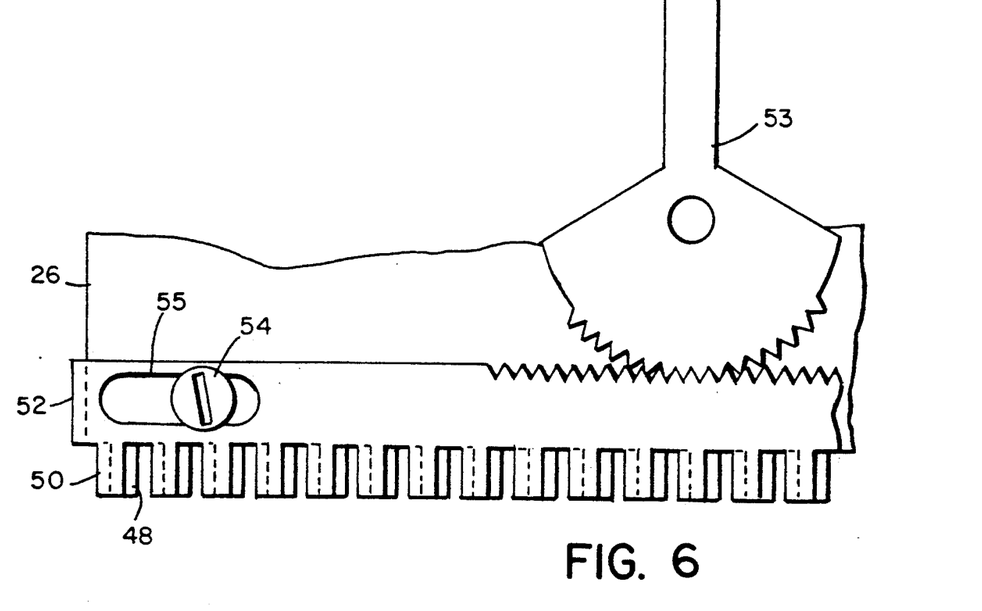
FIG. 6 illustrates the gate structure for admitting air at the base of the shroud.

To introduce air into the spray volume, a gate structure is provided about the base 26 of the shroud. As illustrated in FIG. 6, teeth 48 are formed about the base of the shroud to provide air flow openings. The openings may be 0.05 inch wide and 0.1 inch tall. Such small openings result in high velocity air flow which creates turbulence as it crosses the liquid spray. Complementary teeth 50 are formed in a plate 52 to define openings therebetween. The plate is mounted to the base 26 by set screws 54 through slots 55. By sliding the plate 52, the teeth 50 may be positioned over the openings between the teeth 48 to limit air flow and thus increase the velocity of air drawn between the teeth. The position of the gate plate may be controlled by a lever 53 through a rack and pinion mechanism.

Figure 7:
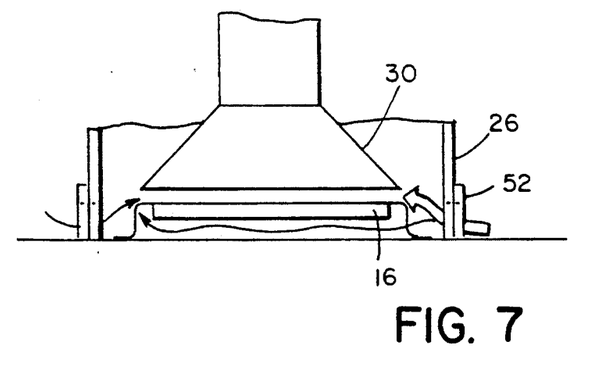
FIG. 7 illustrates the airflow past an electronic component controlled by adjustment of the gates for the drying process.

The gates on the four sides of the rectangular shroud are independently adjustable. If all four sides of the electronic component are cleaned simultaneously, all four gates are opened to an optimal setting which provides optimal turbulence of the air and cleaning or rinsing liquid. Alternatively, less than all sides of the component may be cleaned at one time, and then the gates associated with the sides not being cleaned may totally restrict air flow. Further, during a drying process in which no liquid is sprayed onto the component, the gates may be selectively controlled to control the air flow past the component. For example, in order to dry the surface below the electronic component, two oppositely positioned gates may be closed and the remaining two gates may be opened to permit different levels of air flow. By opening the gate to the right of FIG. 7 to a larger extent, air flow is permitted from the right over the component 16 to the baffle 30 with little restriction. The more restricted flow from the left of FIG. 7 would be of a higher velocity. The pressure to the left would therefore be less than the pressure to the right. As a result of that pressure differential, some of the large flow from the right would be drawn under the electronic component 16 to the left to dry beneath the electronic component 16. Similarly, the gates may be adjusted to direct solution under a component.

Figure 8:
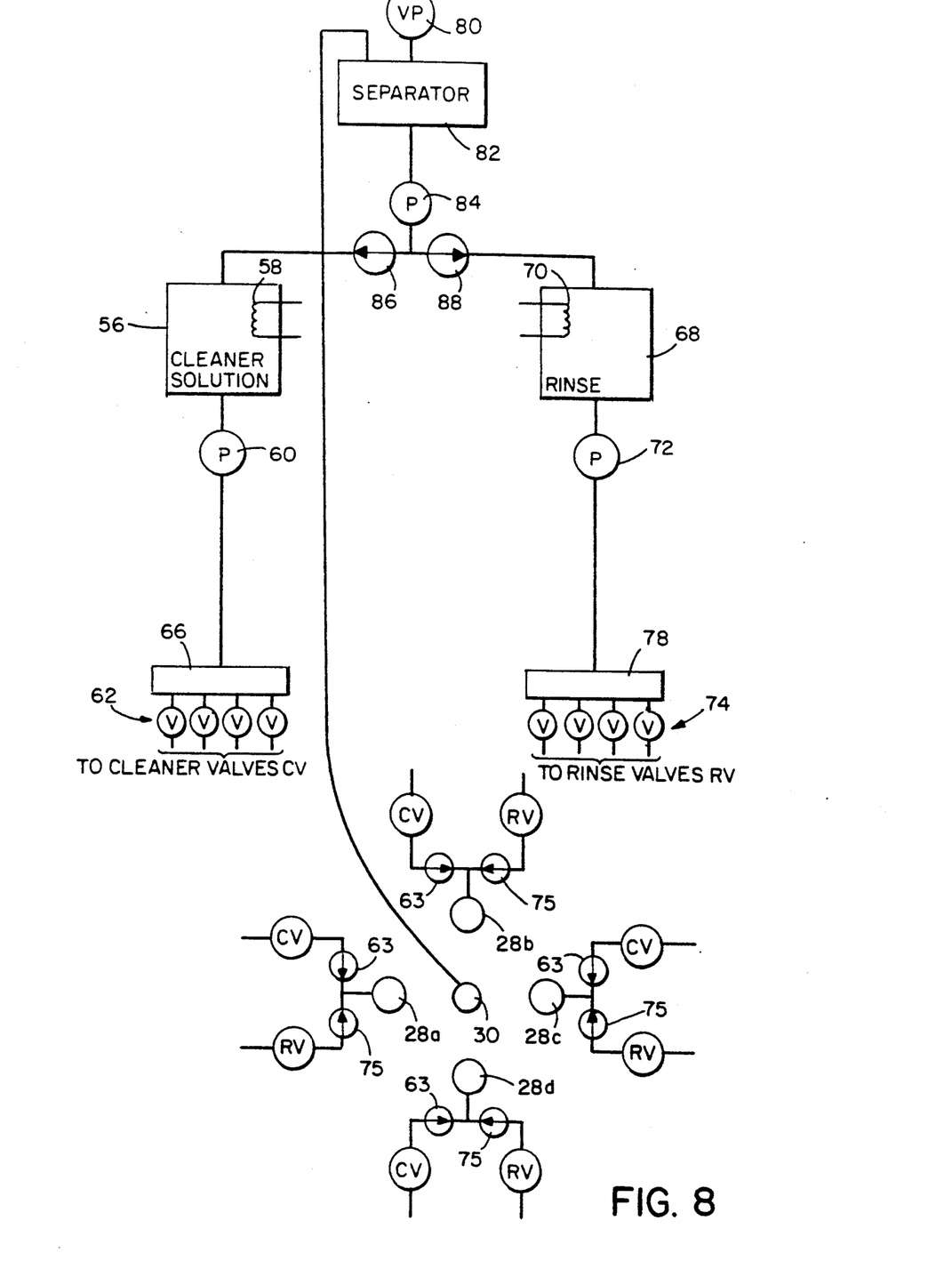
FIG. 8 is a system schematic illustrating the liquid and vacuum control to the apparatus of FIG. 1.

A schematic illustration of the full system is presented in FIG. 8. A supply of cleaning solution 56 is heated by a heating coil 58. The cleaning solution may be the same solution used in in-line systems. A temperature of about 150° F. is typically used in in-line processes and is suited to this application. The cleaning solution is pumped by a pump 60 through a manifold 66 and pressure control valves 62 to each of the four cleaner valves CV. The valves CV are associated with and closely connected to each of the nozzles 28 through check valves 63.

The valves 62 may be controlled in response to the pressure detected by pressure gauges (not shown in FIG. 8) coupled to the valves 62. Pressures of 10-30 psi are preferred when using all four nozzles simultaneously and pressures up to 60 psi may be delivered to a single nozzle. A pressure of 20 psi is most preferred.

Rinse solution from a supply 68 is also heated by a coil 70. The rinse solution is heated to about 170°. That temperature provides for more efficient rinsing, and the warmed component and board are subsequently more quickly dried. The rinse solution is pumped by a pump 72 through a manifold 78 and pressure control valves 74. Valves 74 are coupled to rinse valves RV associated with respective nozzles through check valves 75. Cleaning solution or rinse solution may be selectively applied to any one or more of the nozzles by means of the valves CV and RV.

A common vacuum pump 80 and separator 82 are used to draw and collect either cleaning solution or rinse liquid through the baffle 30. The cleaning solution is returned by a pump 84 through a control valve 86 to the cleaner solution supply 56. A five-gallon supply of cleaner solution may thus be reused to clean as many as a thousand components. Similarly, rinse liquid is returned through a control valve 88 to the rinse solution supply 68. A five-gallon supply may be used to rinse about five hundred components.

The entire system may be packaged as a portable unit and may be controlled manually or by programmed microprocessor. An illustration of such a portable unit is presented in FIG. 9 where reference numerals of FIG. 8 are repeated.

Figure 9:
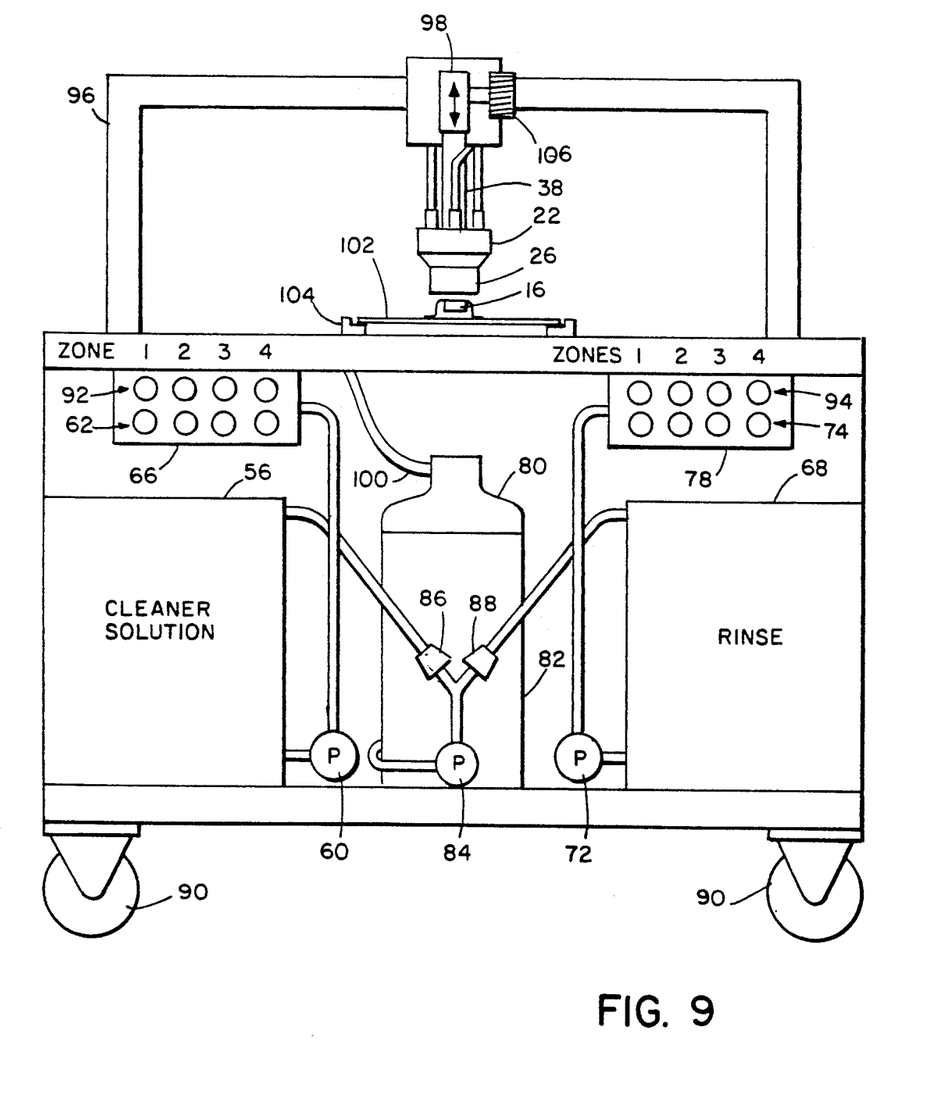
FIG. 9 is an illustration of a portable unit embodying the system of the present invention.

The portable unit of FIG. 9 is mounted on wheels 90. A lower section houses the tanks 56 and 68 of cleaner solution and rinse solution and the vacuum pump 80 and separator 82. Controls to the pressure control valves 62 and 74 are positioned below corresponding pressure gauges 92 and 94 to enable individual pressure control of cleaning solution and rinse solution to each of the valve assemblies. Fluid from the valves 62 and 64 are carried through tubes (not shown) along a gantry 96. The gantry supports a z-position adjustment slide element 98 from which the vacuum conduit 38 is suspended to support the nozzle support structure 22 and shroud 26. The valves CV, RV, 63 and 75 are not shown in FIG. 9 but are preferably mounted to the gantry in close proximity to the z-position adjustment 98. Solution drawn through the central vacuum conduit 38 is carried about the gantry through a tube 100 to the vacuum pump and separator 80, 82.

A printed wiring board 102 is mounted to an x/y motion sliding table 104 while the nozzle assembly 22 and shroud 26 are held in a raised position by the z-position adjustment 98. With movement of the table 104, the component 16 which is to be cleaned is positioned directly below the shroud 26. Then, by adjustment of a knob 106, the slide mechanism is moved down to move the shroud down about the component 16. With the shroud in position, delivery of cleaner solution and then rinse solution is controlled to properly clean the assembly.

While this invention has been particularly shown and described with references to a preferred embodiment thereof, it will be understood by those skilled in the art that various changes in form and details may be made therein without departing from the spirit and scope of the invention as defined by the appended claims.

We claim:

1. Electronic assembly cleaning apparatus for cleaning an area of an electronic assembly occupied by a portion of an electronic component, comprising:
   a source of cleaning solution;
   a plurality of nozzles coupled to said source of cleaning solution for spraying the area with a spray of said cleaning solution, said plurality of nozzles being supported by a nozzle support structure;
   a shroud enclosing said plurality of nozzles and having a base formed to be positioned around the electronic component for confining said spray;
   a vacuum source;
   a plurality of gates in said shroud for controlling an air flow from outside into said shroud; and
   a vacuum return baffle coupled to said vacuum source and positioned within the shroud adjacent the area so as to locate said plurality of nozzles outside said baffle, to cause the air to flow over said area to cause turbulence in said spray at said area to flow over said area to increase the cleaning action of said spray.

2. Apparatus as claimed in claim 1 wherein the nozzles are tiltable to adjust spray angle.

3. Apparatus as claimed in claim 2 wherein said nozzles generate a fan shaped spray, said fan shaped spray extending along leads of said electronic component.

4. Apparatus as claimed in claim 3 comprising ones of a plurality of interchangeable shroud and baffle assemblies alternatively connectable to said nozzle support structure, said plurality of shroud and baffle assemblies being sized for different sizes of electronic components.

5. Apparatus as claimed in claim 3 wherein said shroud has a cross-sectional area at its base which is smaller than the cross-sectional area adjacent to the nozzle support structure.

6. Apparatus as claimed in claim 5 wherein each gate comprises an array of openings in the base of said shroud and a closure plate positionable over said openings of the shroud for varying the size of said openings.

7. Apparatus as claimed in claim 1 wherein each gate comprises an opening in said shroud and means for modifying the size of said opening to vary air flow therethrough.

8. Apparatus as claimed in claim 1 wherein the shroud encloses a cross-sectional area at its base which is smaller than a cross-sectional area enclosed by the shroud adjacent the nozzle support structure, and wherein said cross sectional area adjacent said nozzle support structure has at least three walls, said nozzle support structure supporting one nozzle adjacent each wall of the shroud.

9. Apparatus as claimed in claim 8 wherein each gate comprises an array of openings in the base of said shroud and a closure plate positionable over said openings in said shroud, to vary the size of said openings.

10. Apparatus as claimed in claim 1 further comprising means for stopping the flow of cleaning solution between the source of cleaning solution and the nozzles.

11. Electronic assembly cleaning apparatus as claimed in claim 1 wherein said electronic assembly is a printed wiring board, and further comprises means for supporting and positioning said printed wiring board beneath said shroud and means for supporting said nozzle support structure and said shroud and for adjusting the distance between said printed wiring board and said nozzle support structure and shroud.

12. Electronic assembly cleaning apparatus for cleaning an area of an electronic assembly occupied by a portion of an electronic component comprising:
   a source of cleaning solution;
   a plurality of nozzles coupled to said source of cleaning solution for spraying said area with a spray of said cleaning solution, each of said plurality of nozzles spraying a fan shaped spray and being tiltable to adjust the spray angle, said plurality of nozzles being supported by a nozzle support structure;

a shroud enclosing said plurality of nozzles, having a base formed to be positioned around said electronic component to contain said fan shaped spray, the base enclosing a cross-sectional area which is smaller than a cross-sectional area enclosed by the shroud adjacent the nozzle support structure, the shroud being removably coupled to the nozzle support structure;

a vacuum source;

a plurality of gates in the base of said shroud for controlling an air flow from outside into said shroud, said gates comprising openings;

a vacuum return baffle coupled to the vacuum source and positioned within said shroud adjacent said area so as to locate said plurality of nozzles outside said baffle and so as to cause said air to flow over said area to cause turbulence in said spray at said area to increase the cleaning action of said spray; and means for adjusting the size of at least one of said openings independently of a second one of said openings.

13. Apparatus as claimed in claim 12 comprising ones of a plurality of interchangeable shroud and baffle alternatively connectible to said nozzle support structure, said plurality of shroud and baffle assemblies being sized for different sizes of electronic components.

14. Apparatus as claimed in claim 13 wherein each gate comprises an array of openings in the base of the shroud and a closure plate positionable over the openings of the shroud for varying the size of said openings.

15. Apparatus as claimed in claim 14 further comprising means for stopping the flow of cleaning solution between the source of cleaning solution and nozzles.

16. Electronic assembly cleaning apparatus as claimed in claim 15 further comprising an x/y motion table for supporting and positioning a printed wiring board beneath said shroud and means for supporting said nozzle support structure and for adjusting the distance between said printed circuit board and said nozzle support structure and shroud.

17. Electronic assembly cleaning apparatus for cleaning an area of an electronic assembly comprising:

a source of cleaning solution;

a source of rinse solution;

an x/y motion table for supporting and positioning a printed wiring board in a plane;

means for adjusting the position of said printed wiring board in a direction orthogonal to said plane of said x/y motion table;

a nozzle support structure supporting a plurality of nozzles for selectively spraying the area with cleaning solution and rinse solution;

a shroud supported by said nozzle support structure and enclosing said plurality of nozzles having a base to be positioned around said area to confine the spray from said nozzles to said area;

a vacuum source coupled to the shroud to withdraw cleaning solution from said area.

* * * * *